US010436403B2

(12) United States Patent
Warner et al.

(10) Patent No.: US 10,436,403 B2
(45) Date of Patent: Oct. 8, 2019

(54) DUAL PRINTED CIRCUIT BOARD

(71) Applicant: Valeo North America, Inc., Troy, MI (US)

(72) Inventors: Gavin Warner, Seymour, IN (US);
Patrick Martin, Columbus, IN (US);
Cameron Betz, Seymour, IN (US);
Brian Hunt, Columbus, IN (US);
Sergio Aguirre, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 112 days.

(21) Appl. No.: 15/608,241

(22) Filed: May 30, 2017

(65) Prior Publication Data
US 2018/0347780 A1 Dec. 6, 2018

(51) Int. Cl.
*F21S 41/19* (2018.01)
*B60Q 1/00* (2006.01)
*H05K 1/02* (2006.01)
*F21S 41/141* (2018.01)
*F21S 41/151* (2018.01)
(Continued)

(52) U.S. Cl.
CPC .......... *F21S 41/192* (2018.01); *B60Q 1/0094* (2013.01); *F21S 41/141* (2018.01); *F21S 41/151* (2018.01); *F21S 41/155* (2018.01); *H05K 1/0295* (2013.01); *H05K 1/144* (2013.01); *H05K 2201/041* (2013.01); *H05K 2201/043* (2013.01); *H05K 2201/10106* (2013.01); *H05K 2201/10189* (2013.01)

(58) Field of Classification Search
CPC ....... F21S 41/192; B60Q 1/0094; H05K 1/14; H05K 1/0274
See application file for complete search history.

(56) References Cited

U.S. PATENT DOCUMENTS 8,123,377 B2 * 2/2012 Lundberg ............... B64D 47/06
362/243
8,833,990 B2 * 9/2014 Tessnow .............. F21S 48/1104
174/153 G
(Continued)

FOREIGN PATENT DOCUMENTS

CN         203642034 U     6/2014
JP         2010-135110 A   6/2010
KR     10-2009-0096670 A   9/2009

*Primary Examiner* — Tsion Tumebo
(74) *Attorney, Agent, or Firm* — Oblon, McClelland, Maier & Neustadt, L.L.P.

(57) ABSTRACT

A dual printed circuit board assembly for vehicle lights, the dual printed circuit board including a dual printed circuit board and a dual connector. The dual printed circuit board having a first substrate with a first layout, a second substrate opposite to the first substrate with a second layout, and a common panel that supports the first substrate on a first side and the second substrate on a second side, wherein the first layout is populable by a first plurality of light sources to be used in a first light of the vehicle lights and the second layout is populable by a second plurality of light sources to be used in a second light of the vehicle lights. The dual connector having a first jumper connector electrically connected to the first layout, and a second jumper connector opposite to the first jumper connector and electrically connected to the second layout.

20 Claims, 4 Drawing Sheets

(51) Int. Cl.
*H05K 1/14* (2006.01)
*F21S 41/155* (2018.01)

(56) References Cited

U.S. PATENT DOCUMENTS

| | | | | |
|---|---|---|---|---|
| 8,992,044 B2* | 3/2015 | Moeck | ...................... | F21K 9/00 |
| | | | | 362/247 |
| 9,200,774 B2* | 12/2015 | Schaefer | ................ | F21V 17/101 |
| 9,400,090 B2* | 7/2016 | Arita | ...................... | F21S 41/19 |
| 9,638,388 B2* | 5/2017 | DiPenti | ................... | F21V 23/02 |
| 10,043,960 B2* | 8/2018 | Andrews | ................ | H01L 33/60 |
| 2003/0227774 A1* | 12/2003 | Martin | ...................... | F21V 7/09 |
| | | | | 362/240 |
| 2004/0213014 A1* | 10/2004 | Koike | ...................... | F21K 9/00 |
| | | | | 362/545 |
| 2004/0223338 A1* | 11/2004 | Koike | ...................... | F21V 29/20 |
| | | | | 362/545 |
| 2008/0225544 A1* | 9/2008 | Fujiwara | .............. | B60Q 1/0041 |
| | | | | 362/538 |
| 2009/0097247 A1* | 4/2009 | Tseng | ........................ | F21K 9/00 |
| | | | | 362/241 |
| 2009/0147508 A1 | 6/2009 | Bertram et al. | | |
| 2010/0321758 A1* | 12/2010 | Bugno | .................... | B60R 1/088 |
| | | | | 359/267 |
| 2011/0149588 A1 | 6/2011 | Schnerr et al. | | |
| 2012/0140466 A1* | 6/2012 | Yang | ...................... | F21V 7/0008 |
| | | | | 362/235 |
| 2012/0201043 A1* | 8/2012 | Di Penti | ................ | F21V 23/02 |
| | | | | 362/545 |
| 2014/0017912 A1* | 1/2014 | Ha | ........................ | H01R 12/73 |
| | | | | 439/74 |
| 2014/0160754 A1* | 6/2014 | Lee | ..................... | H01L 25/0753 |
| | | | | 362/237 |
| 2014/0218954 A1* | 8/2014 | Yoon | ...................... | H01L 33/62 |
| | | | | 362/546 |
| 2014/0239316 A1* | 8/2014 | Andrews | ................ | F21K 9/233 |
| | | | | 257/88 |
| 2014/0355286 A1* | 12/2014 | Arita | ...................... | F21S 41/19 |
| | | | | 362/516 |

\* cited by examiner

DUAL PRINTED CIRCUIT BOARD

BACKGROUND

Field of the Disclosure

The present disclosure relates to printed circuit boards and in particular to printed circuit boards for automotive light equipment.

Description of the Related Art

Task of mounting and/or assembling a product into different configurations in assembly lines can be cumbersome and expensive as such tasks can require specific parts, and/or specific suppliers for each configuration.

This is particularly relevant for automotive industry and notably in lighting systems that often require the type of electronic light sources used to be changed depending on cost, selection of suppliers, and/or technological changes. When the type of electronic light sources is changed a different printed circuit board with a different configuration, e.g. a different layout with different electrical components, can be required which can be cost and time consuming.

In addition, automotive lighting systems can require head lights of a vehicle to be mounted in a right hand side configuration and in a left hand side configuration. Particularly, in such lighting systems the right hand side light and the left hand side light may require different printed circuit boards populated with different electronic light sources to project a right hand side light pattern and a left hand side light pattern that are different form each other to limits light directed toward a vehicle coming in the opposite direction.

Thus, a circuit board assembly that can be mounted and used with different types of light sources with different configurations is needed.

SUMMARY

Accordingly, the object of the present disclosure is to provide a dual printed circuit board assembly which overcomes the above-mentioned limitations of versatility.

The dual printed circuit board of the present disclosure provides a single circuit board assembly that can be used in a plurality of configurations with different types and/or models of light sources. In addition, the dual printed circuit board of the present disclosure can be mounted on a right hand side light as well as on a left hand side light of a vehicle.

In one non-limiting illustrative example, a dual circuit board for vehicle lights is presented. The dual circuit board includes a first substrate with a first layout, a second substrate opposite to the first substrate with a second layout, and a common panel that supports the first substrate on a first side and the second substrate on a second side, wherein the first layout is populable by a first plurality of light sources to be used in a first light of the vehicle lights and the second layout is populable by a second plurality of light sources to be used in a second light of the vehicle lights.

In one aspect, the first layout and the second layout are connected through the common panel to provide electrical insulation.

In another aspect, the first plurality of light sources include a first plurality of solid state light sources and the second plurality of light sources includes a second plurality of solid state light sources different from the first plurality of solid state light sources.

In another aspect, the first substrate has a first shape and the second substrate has a second shape mirror image symmetry of the first shape.

In another aspect, the first substrate includes a first plurality of openings and the second substrate includes a second plurality of openings that matches and is aligned with the first plurality of openings to provide mounting for the first light and the second light.

In another aspect, the first plurality of openings includes a first pair of square holes.

In another aspect, the first substrate includes a first connector and the second substrate includes a second connector opposite to the first connector.

In one non-limiting illustrative example, a dual circuit board assembly for vehicle lights is presented. The dual circuit board assembly includes a dual printed circuit board having a first substrate with a first layout, a second substrate opposite to the first substrate with a second layout, and a common panel that supports the first substrate on a first side and the second substrate on a second side, wherein the first layout is populable by a first plurality of light sources to be used in a first light of the vehicle lights and the second layout is populable by a second plurality of light sources to be used in a second light of the vehicle lights, and a dual connector having a first jumper connector electrically connected to the first layout, and a second jumper connector opposite to the first jumper connector and electrically connected to the second layout.

In one aspect, the first layout and the second layout are connected through the common panel to provide electrical insulation.

In another aspect, the first plurality of light sources include a first plurality of solid state light sources that emits a first light pattern and the second plurality of light sources includes a second plurality of solid state light sources that emits a second light pattern different froth the first light pattern.

In another aspect, the first substrate has a first shape and the second substrate has a second shape mirror image symmetry of the first shape.

In another aspect, the first substrate includes a first plurality of openings and the second substrate includes a second plurality of openings that matches and is aligned with the first plurality of openings to provide mounting for dual printed circuit board inside the first light and the second light.

In another aspect, the first plurality of openings includes a first pair of square holes.

In another aspect, the first substrate includes a first connector and the second substrate includes a second connector opposite to the first connector.

In one non-limiting illustrative example, a lighting system for vehicle lights is presented. The lighting system includes a first light that emits first light pattern, a second light that emits a second light pattern, a dual printed circuit board receivable by the first light and the second light, the dual printed circuit having a first substrate d with a first layout, a second substrate opposite to the first substrate with a second layout, and a common panel that supports the first substrate on a first side and the second substrate on a second side, wherein the first layout is populable by a first plurality of light sources to project the first light pattern from the first light of the vehicle lights and the second layout is populable by a second plurality of light sources to project the second light pattern from the second light, and a dual connector having a first jumper connector electrically connected to the vehicle power system and to the first layout, and a second jumper connector opposite to the first jumper connector and electrically connected to the power system and to the second layout.

In one aspect, the first layout and the second layout are connected through the common panel to provide electrical insulation.

In another aspect, the first plurality of light sources include a first plurality of solid state light sources that emits the first light pattern and the second plurality of light sources includes a second plurality of solid state light sources that emits the second light pattern.

In another aspect, the first substrate has a first shape and the second substrate has a second shape mirror image symmetry of the first shape.

In another aspect, the first substrate includes a first plurality of openings and the second substrate includes a second plurality of openings that matches and is aligned with the first plurality of openings to provide mounting for dual printed circuit board inside the first light and the light.

In another aspect, the first plurality of openings includes a first pair of square holes.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
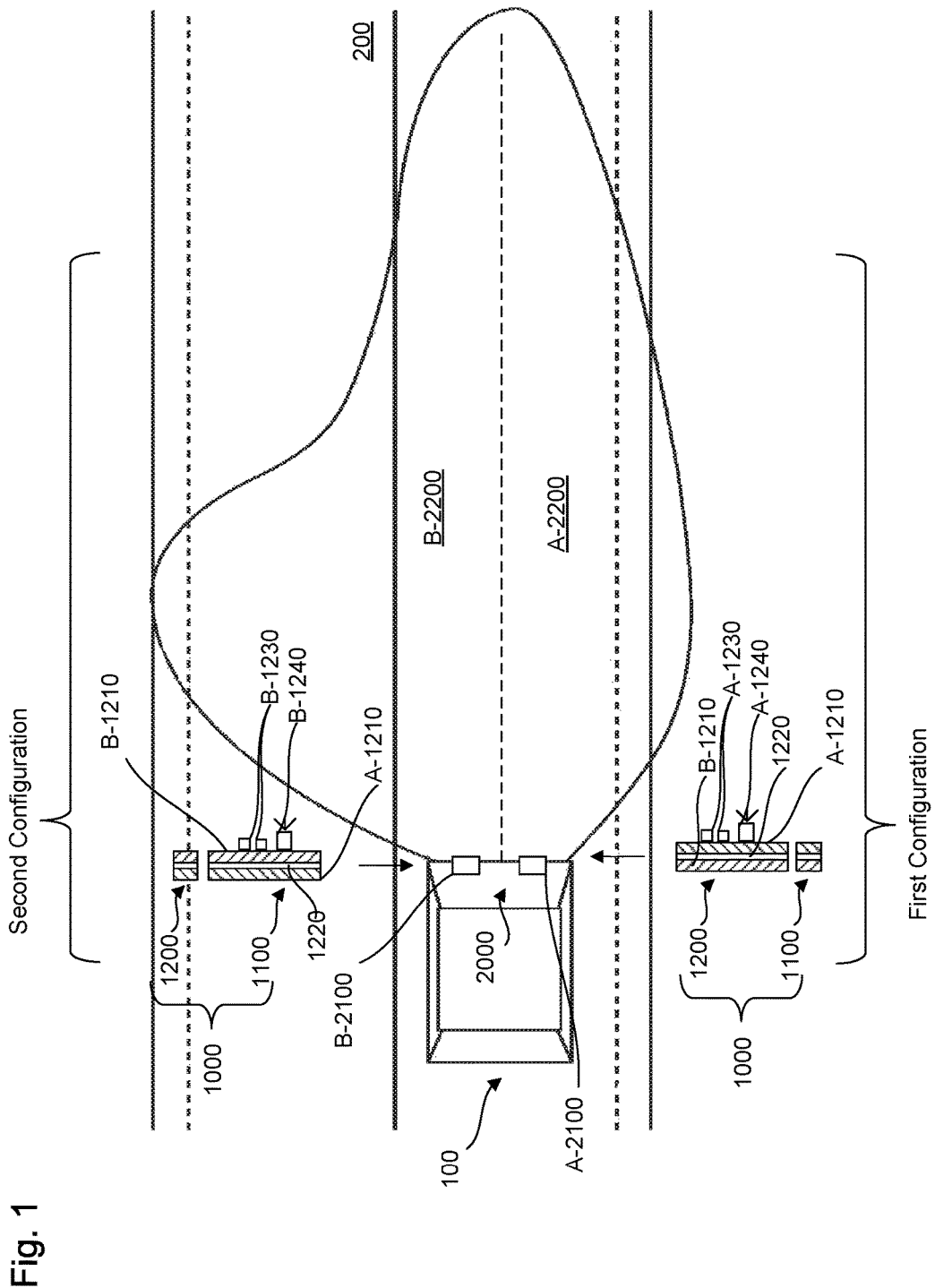
FIG. 1 is a schematic view of a dual printed circuit board assembly in a first configuration and in a second configuration, according to certain aspects of the disclosure.

All publications, patent applications, patents, and other references mentioned herein are incorporated by reference in their entirety. Further, the materials, methods, and examples discussed herein are illustrative only and are not intended to be limiting.

In the drawings, like reference numerals designate identical or corresponding parts throughout the several views. Further, as used herein, the words "a", "an", and the like include a meaning of "one or more", unless stated otherwise. The drawings are generally drawn not to scale unless specified otherwise or illustrating schematic structures or flowcharts.

FIG. 1 is a schematic view of a dual printed circuit board assembly 1000 in a first configuration and in a second configuration, according to certain aspects of the disclosure.

The dual printed circuit board assembly 1000 provides versatility that can result in lowering production and/or assembling cost. The dual printed circuit board assembly 1000 provides a single printed circuit board assembly that can be mounted in a lighting system 2000 of a vehicle 100 in a plurality of configurations with different types and/or models of light sources.

For example, the dual printed circuit board assembly 1000 can be mounted in a first configuration with a first plurality of components A-1230 and a first plurality of light sources A-1240 and in a second configuration with a second plurality of components B-1230 and a second plurality of light sources B-1240.

In another example, the first configuration can be mounted on a first side headlight A-2100 of the lighting system 2000, e.g. driver's side headlight, with the first plurality of light sources A-1240 to project a first light pattern A-2200, as illustrated in FIG. 1, and the second configuration can be mounted on a second side headlight B-2100, e.g. passenger's side headlight system, with the second plurality of light sources B-1240 to project a second light pattern B-2200, as illustrated in FIG. 1. The difference between the first light pattern A-2200 and the second light pattern B-2200 can be predetermined to limit light directed towards other vehicles coming in the opposite direction as the vehicle 100. For example, the first light pattern A-2200 can be less intense and be directed more towards a road surface 200 than the second light pattern B-2200, as illustrated in FIG. 1.

Figure 2A:
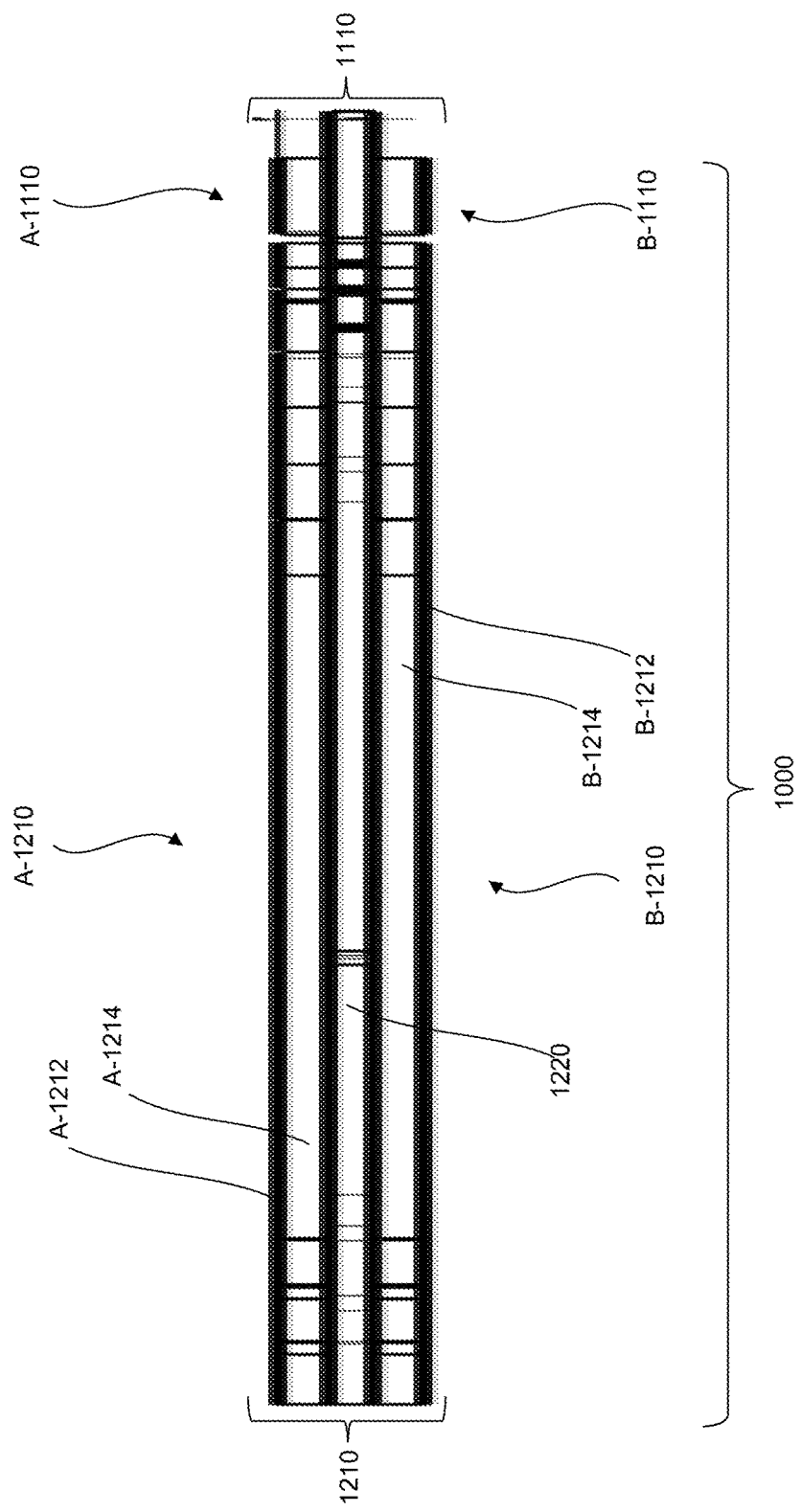
FIG. 2A is a profile view of the dual printed circuit board assembly, according to certain aspects of the disclosure.
Figure 2B:
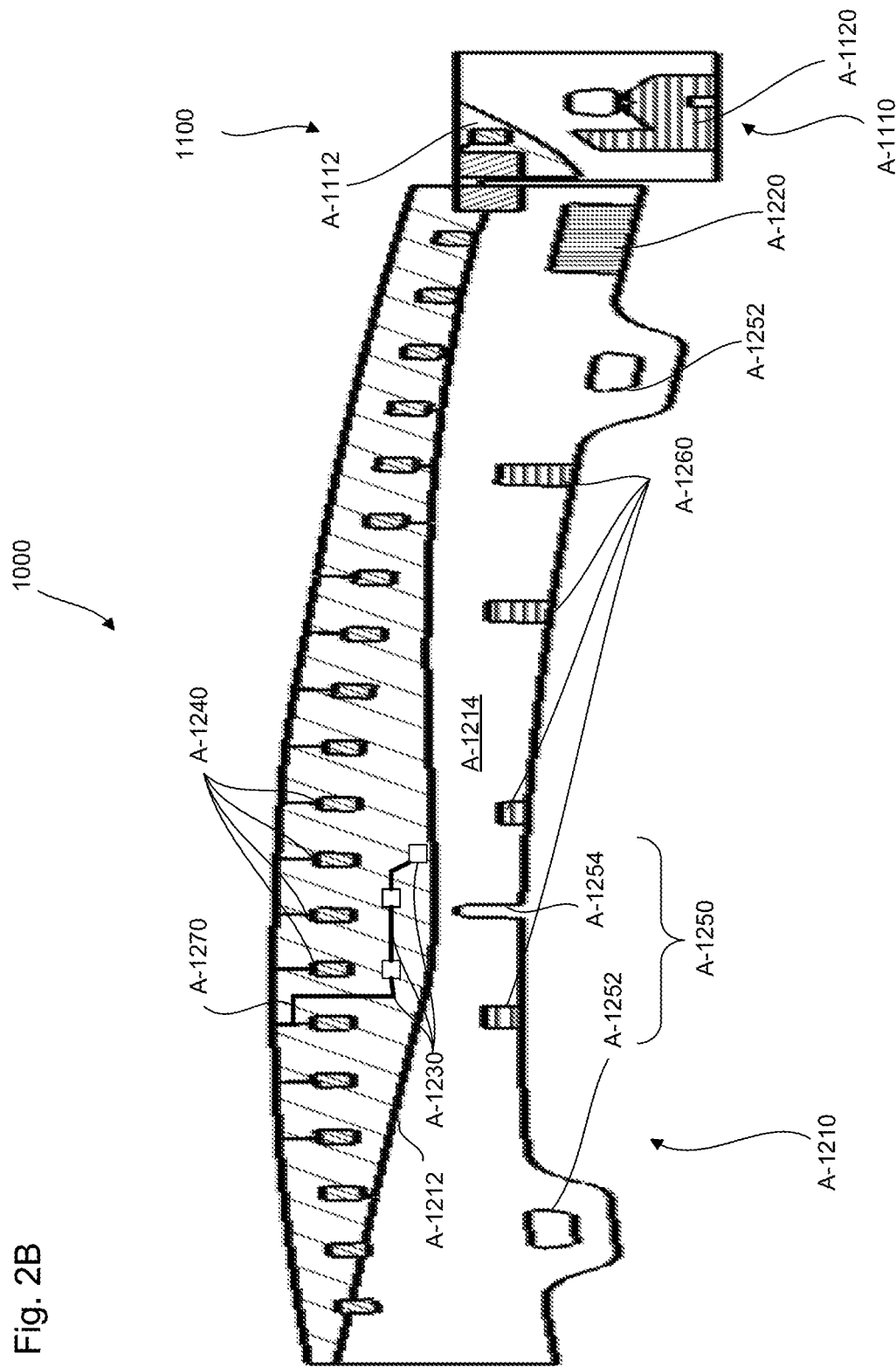
FIG. 2B is a first side view of the dual printed circuit board assembly, according to certain aspects of the disclosure.
Figure 2C:
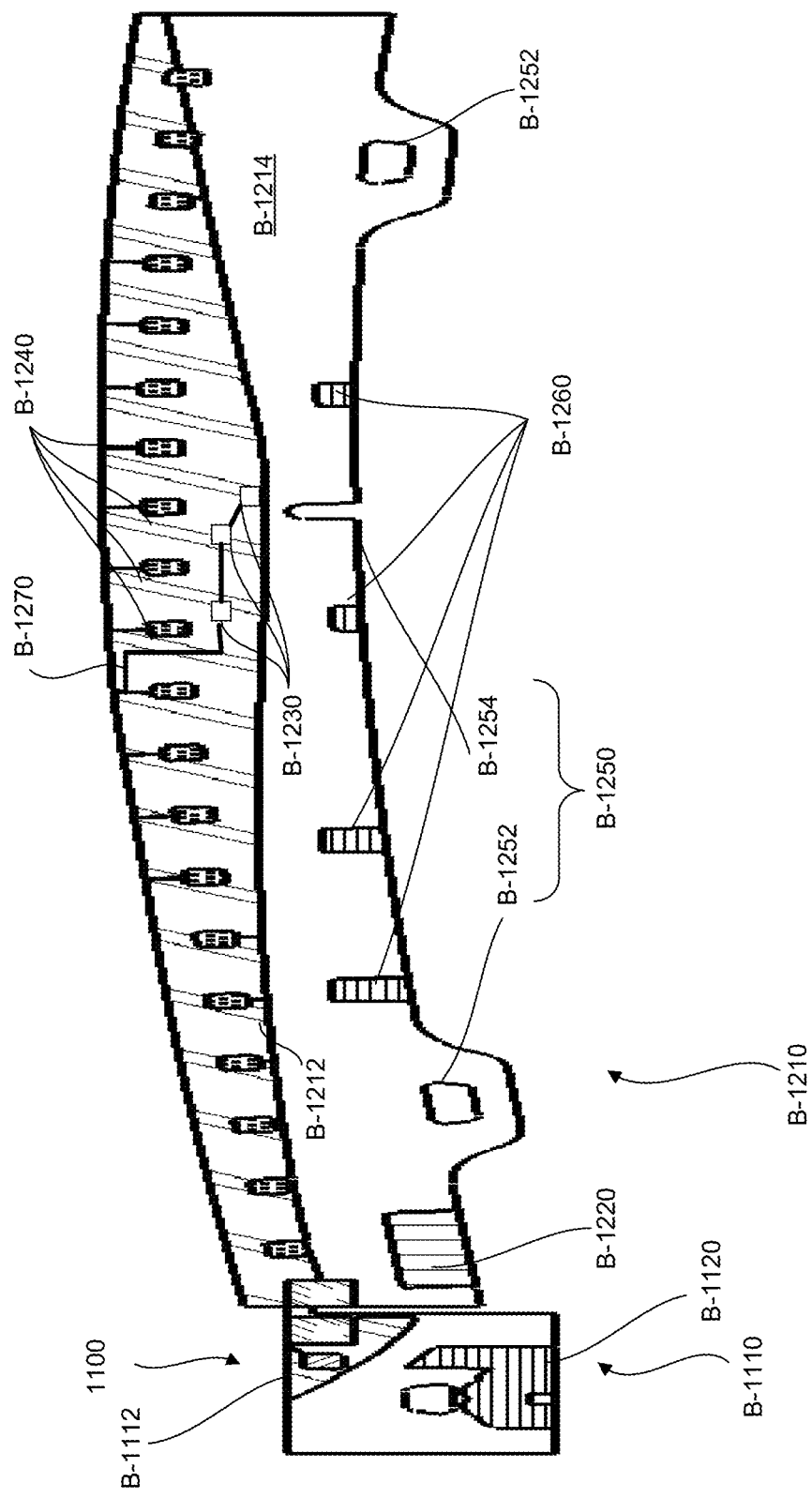
FIG. 2C is a second side view of the dual printed circuit board assembly, according to certain aspects of the disclosure.

FIGS. 2A-2C are a profile view, a first side view, and a second side view of the dual printed circuit board assembly 1000, according to certain aspects of the disclosure.

The dual printed circuit board assembly 1000 can include a dual connector 1100 and a dual printed circuit board 1200 movably connected to the dual connector 1100.

The dual printed circuit board 1200 can include a first substrate A-1210, a second substrate B-1210 opposite to the first substrate A-1210, and a common panel 1220 that supports the first substrate A-1210 on a first side and the second substrate B-1210 on a second side of the common panel 1220.

The first substrate A-1210 can include a first component area A-1212 wired to the dual connector 1100 and a first non-component area A-1214 affixable to the lighting system 2000.

The first component area A-1212 can include a first layout A-1270 that can be populated by the first plurality of components A-1230 to provide and manage power from the dual connector 1100 to the first plurality of light sources A-1240, e.g. solid state light sources such as light emitting diodes (LEDs), organic light emitting diodes (OLEDs), polymer light emitting diodes (PLEDs), and/or monolithic LEDs. The first plurality of components A-1230 and the first plurality of light sources A-1240 can be selected to provide the first light pattern A-2200 in the first configuration.

The first non-component area A-1214 can include a first plurality of non-conductive areas A-1260, a first plurality of openings A-1250 to provide affixing between the dual printed circuit board 1000 and the lighting system 2000, and a first main connector A-1220 to electrically connect the first layout A-1270. The first plurality of openings A-1250 can include a first pair of square holes A-1252 and a first notch A-1254 configured to receive protrusions that match shapes of the first pair of square holes A-1252 and the first notch A-1254, as illustrated in FIG. 2A.

In addition, the dual printed circuit board assembly 1000 can be affixed and/or mounted to either the first side headlight A-2100 or the second side headlight B-2100 via fastening devices, e.g. screws, snaps, and/or straps, inserted between the dual printed circuit board assembly 1000 and a support, e.g. housing, of the first side headlight A-2100 or the second side headlight B-2100.

The second substrate B-1210 can include a second component area B-1212 wired to the dual connector 1100 and a second non-component area B-1214 affixable to the lighting system 2000.

The second component area B-1212 can expose a second layout B-1270 that can be populated by the second plurality of components B-1230 to provide and manage power from the dual connector 1100 to the second plurality of light sources B-1240, e.g. solid state light sources such as light emitting diodes (LEDs), organic light emitting diodes (OLEDs), polymer light emitting diodes (PLEDs), and/or monolithic LEDs. The second plurality of components B-1230 and the second plurality of light sources B-1240 can be selected to provide the second light pattern B-2200 in the first configuration.

The second non-component area B-1214 can include a second plurality of non-conductive areas B-1260, a second plurality of openings B-1250 to provide affixing between the dual printed circuit board 1000 and the lighting system 2000, and a second main connector B-1220 to electrically connect the second layout A-1270. The second plurality of openings B-1250 an include a second pair of square holes B-1252 and a second notch B-1254 configured to receive protrusions that match shapes of the second pair of square holes B-1252 and the second notch B-1254 as illustrated in FIG. 2C.

The first substrate A-1210 and the second substrate B-1210 can have symmetrical characteristics to enable the dual printed board assembly 1000 to be placed in the first configuration or in the second configuration. For example, the first component area A-1212 and the second component area B-1212 can be mirror images of each other. Similarly, the first non-component area A-1214 and the second non-component area B-1214 can be mirror ages of each other, with the first plurality of openings A-1250 matching and being aligned with the second plurality of openings B-1250.

The dual connector 1100 can include a first connector side A-1110 that is substantially aligned with the first substrate A-1210 and a second connector side B-110 that is substantially aligned with the second substrate B-1210.

The first connector side A-1110 can include a first jumper connector A-1112 that is wired to the first component area A-1212 and a first connector non-conductive area A-1120 to be affixed to the lighting system 2000 in the first configuration.

The second connector side B-1110 can include a second jumper connector B-1112 that is wired to the second component area B-1212 and a second connector non-conductive area B-1120 to be affixed to the lighting system 2000 in the second configuration.

Similarly to the first substrate A-1210 and the second substrate B-1210, the first connector side A-1120 and the second connector side B-1120 can have symmetrical characteristics to enable the dual printed circuit board assembly 1000 to be placed in the first configuration or the second configuration. For example, the first jumper connector A-1112 and the second jumper connector B-1112 can be mirror images of each other. Similarly, the first connector non-conductive area A-1120 and the second connector non-conductive area B-1120 can be mirror images of each other.

The first substrate A-1210 can include a first top layer A-1212, and a first conductive layer A-1214 between the common panel 1220 and the first top layer A-1212, as illustrated in FIG. 2A. The first conductive layer A-1214 can provide electrical conductions for the first plurality of components A-1230 while the first top layer A-1212 can cover electrical connections between the first plurality of components A-1230 and the first conductive layer A-1214 and provide electrical insulation. The first top layer A-1212 can be made of a non-conductive material such as glass epoxy while the first conductive layer A-1214 can be made of a conductive material such as copper alloy and/or aluminum alloy.

Similarly to the first substrate A-1210, the second substrate B-1210 can include a second top layer B-1212, and a second conductive layer B-1214 between the common panel 1220 and the second top layer B-1212, as illustrated in FIG. 2A. The second conductive layer B-1214 can provide electrical conductions for the second plurality of components B-1230 while the second top layer B-1212 can cover electrical connections between the second plurality of components B-1230 and the second conductive layer B-1214 and provide electrical insulation. The second top layer B-1212 can be made of a non-conductive material such as glass epoxy while the second conductive layer B-1214 can be made of a conductive material such as copper alloy and/or aluminum alloy.

The common panel 1220 can bond the first substrate A-1210 to the second substrate B-1210 and can provide electrical and/or thermal insulations between the first layout A-1270 of the first substrate A-1210 and the second layout B-1270 of the second substrate B-1210. For example, the common panel 1220 can be made of dielectric materials.

The foregoing discussion discloses and describes merely exemplary embodiments of an object of the present disclosure. As will be understood by those skilled in the art, an object of the present disclosure may be embodied in other specific forms without departing from the spirit or essential characteristics thereof. Accordingly, the present disclosure is intended to be illustrative, but not limiting of the scope of an object of the present disclosure as well as the claims.

Numerous modifications and variations on the present disclosure are possible in light of the above teachings. It is therefore to be understood that within the scope of the appended claims, the disclosure may be practiced otherwise than as specifically described herein.

What is claimed is:

1. A dual printed circuit board for vehicle lights, the dual printed circuit board comprising:
    a first substrate with a first layout;
    a second substrate opposite to the first substrate with a second layout; and
    a common panel that supports the first substrate on a first side and the second substrate on a second side, wherein
    the first layout is populable by a first plurality of light sources to project light from a first light of the vehicle lights and the second layout is populable by a second plurality of light sources to project light from a second light of the vehicle lights,
    when the dual printed circuit board is mounted in the first light, the second substrate is between a mount of the first light and the first substrate, and
    when the dual printed circuit board is mounted in the second light, the first substrate is between a mount of the second light and the second substrate.

2. The dual printed circuit board of claim 1, wherein the first layout and the second layout are connected through the common panel to provide electrical insulation.

3. The dual printed circuit board of claim 1, wherein the first plurality of light sources include a first plurality of solid state light sources and the second plurality of light sources includes a second plurality of solid state light sources different from the first plurality of solid state light sources.

4. The dual printed circuit board of claim 1, wherein the first substrate has a first shape and the second substrate has a second shape mirror image symmetry of the first shape.

5. The dual circuit printed board of claim 1, wherein the first substrate includes a first plurality of openings and the second substrate includes a second plurality of openings that matches and is aligned with the first plurality of openings to provide mounting for the first light and the second light.

6. The dual circuit printed board of claim 5, wherein the first plurality of openings includes a first pair of square holes.

7. The dual circuit printed board of claim 1, wherein the first substrate includes a first connector and the second substrate includes a second connector opposite to the first connector.

8. A dual printed circuit board assembly for vehicle lights, the dual printed circuit board comprising:
   a dual printed circuit board including:
      a first substrate with a first layout,
      a second substrate opposite to the first substrate with a second layout, and
      a common panel that supports the first substrate on a first side and the second substrate on a second side, wherein
      the first layout is populable by a first plurality of light sources to project light from a first light of the vehicle lights and the second layout is populable by a second plurality of light sources to project light from a second light of the vehicle lights,
   when the dual printed circuit board is mounted in the first light, the second substrate is between a mount of the first light and the first substrate, and
   when the dual printed circuit board is mounted in the second light, the first substrate is between a mount of the second light and the second substrate; and
   a dual connector including:
      a first jumper connector electrically connected to the first layout, and
      a second jumper connector opposite to the first jumper connector and electrically connected to the second layout.

9. The dual printed circuit board of claim 8, wherein the first layout and the second layout are connected through the common panel to provide electrical insulation.

10. The dual printed circuit board of claim 8, wherein the first plurality of light sources include a first plurality of solid state light sources that emits a first light pattern and the second plurality of light sources includes a second plurality of solid state light sources that emits a second light pattern different from the first light pattern.

11. The dual printed circuit board of claim 8, wherein the first substrate has a first shape and the second substrate has a second shape mirror image symmetry of the first shape.

12. The dual circuit printed board of claim 8, wherein the first substrate includes a first plurality of openings and the second substrate includes a second plurality of openings that matches and is aligned with the first plurality of openings to provide mounting for dual printed circuit board inside the first light and the second light.

13. The dual circuit printed board of claim 12, wherein the first plurality of openings includes a first pair of square holes.

14. The dual circuit printed board of claim 8, wherein the first substrate includes a first connector and the second substrate includes a second connector opposite to the first connector.

15. A lighting system for vehicle comprising:
   a first light that emits a first light pattern;
   a second light that emits a second light pattern;
   a dual printed circuit board receivable by the first light and the second light, the dual printed circuit including:
      a first substrate with a first layout,
      a second substrate opposite to the first substrate with a second layout, and
      a common panel that supports the first substrate on a first side and the second substrate on a second side, wherein
      the first layout is populable by a first plurality of light sources to project the first light pattern from the first light of the vehicle lights and the second layout is populable by a second plurality of light sources to project the second light pattern from the second light,
   when the dual printed circuit board is mounted in the first light, the second substrate is between a mount of the first light and the first substrate, and
   when the dual printed circuit board is mounted in the second light, the first substrate is between a mount of the second light and the second substrate; and
   a dual connector including:
      a first jumper connector electrically connected to the vehicle power system and to the first layout, and
      a second jumper connector opposite to the first jumper connector and electrically connected to the power system and to the second layout.

16. The dual printed circuit board of claim 15, wherein the first layout and the second layout are connected through the common panel to provide electrical insulation.

17. The dual printed circuit board of claim 15, wherein the first plurality of light sources include a first plurality of solid state light sources that emits the first light pattern and the second plurality of light sources includes a second plurality of solid state light sources that emits the second light pattern.

18. The dual printed circuit board of claim 15, wherein the first substrate has a first shape and the second substrate has a second shape mirror image symmetry of the first shape.

19. The dual circuit printed board of claim 15, wherein the first substrate includes a first plurality of openings and the second substrate includes a second plurality of openings that matches and is aligned with the first plurality of openings to provide mounting for dual printed circuit board inside the first light and the light.

20. The dual circuit printed board of claim 19, wherein the first plurality of openings includes a first pair of square holes.

* * * * *